US012658840B1

(12) United States Patent
Zhao et al.

(10) Patent No.: US 12,658,840 B1
(45) Date of Patent: Jun. 16, 2026

(54) DATA CENTER-BASED MULTI-ENERGY COMPLEMENTARY SYSTEM

(71) Applicant: CHINA UNIVERSITY OF MINING AND TECHNOLOGY, Xuzhou (CN)

(72) Inventors: Peng Zhao, Xuzhou (CN); Xiaozhao Li, Xuzhou (CN); Xue Wang, Xuzhou (CN); Huiyuan Wang, Xuzhou (CN); Zihao Wang, Xuzhou (CN); Ruowei Shi, Xuzhou (CN)

(73) Assignee: CHINA UNIVERSITY OF MINING AND TECHNOLOGY, Xuzhou (CN)

( * ) Notice: Subject to any disclaimer, the term of this patent is extended or adjusted under 35 U.S.C. 154(b) by 0 days.

(21) Appl. No.: 19/375,374

(22) Filed: Oct. 31, 2025

(30) Foreign Application Priority Data

Jul. 24, 2025 (CN) .......................... 202511021014.6

(51) Int. Cl.
| | |
|---|---|
| *H02S 10/30* | (2014.01) |
| *F24T 10/13* | (2018.01) |
| *H02S 10/10* | (2014.01) |
| *H02S 10/20* | (2014.01) |
| *H05K 7/20* | (2006.01) |

(52) U.S. Cl.
CPC .............. *H02S 10/10* (2014.12); *F24T 10/13* (2018.05); *H02S 10/20* (2014.12); *H02S 10/30* (2014.12); *H05K 7/208* (2013.01)

(58) Field of Classification Search
CPC ......... H02S 10/00–40; H02S 40/00–44; Y02E 10/60
USPC ................................................ 136/243–265
See application file for complete search history.

(56) References Cited

U.S. PATENT DOCUMENTS

2025/0358978 A1* 11/2025 Xu ........................ H05K 7/2079

FOREIGN PATENT DOCUMENTS

| | | | | |
|---|---|---|---|---|
| CN | 117109201 A | * | 11/2023 | ............ F16K 11/085 |
| CN | 118499959 A | | 8/2024 | |
| CN | 119983361 A | | 5/2025 | |
| WO | WO-2023231726 A1 | * | 12/2023 | .............. F25B 30/06 |

OTHER PUBLICATIONS

CN-117109201-A English (Year: 2023).*
WO-2023231726-A1 English (Year: 2023).*

* cited by examiner

*Primary Examiner* — Bach T Dinh
(74) *Attorney, Agent, or Firm* — Bayramoglu Law Offices LLC

(57) ABSTRACT

The provided is a data center-based multi-energy complementary system, including a data center, an energy pile group, a storage battery, an inverter, a solar photovoltaic/thermal (PV/T) panel, a medium-deep borehole heat exchanger (MDBHE), a chiller, a user, an absorption refrigeration unit, a chilled water tank, a supply header, a return header, a waste heat pump unit, a hot water storage tank, a ground source heat pump (GSHP) unit, a cold-hot water tank, a plurality of four-way valves, a plurality of valves, a plurality of cooling towers, a plurality of water circulating pumps, and a plurality of plate heat exchangers. Various devices are connected to form different loops. The provided constructs a hierarchical heat storage system by means of the energy pile group in the shallow geostructure and the MDBHE, and realizes cascaded energy utilization in combination with the solar PV/T panel technology, thereby forming an integrated system.

6 Claims, 1 Drawing Sheet

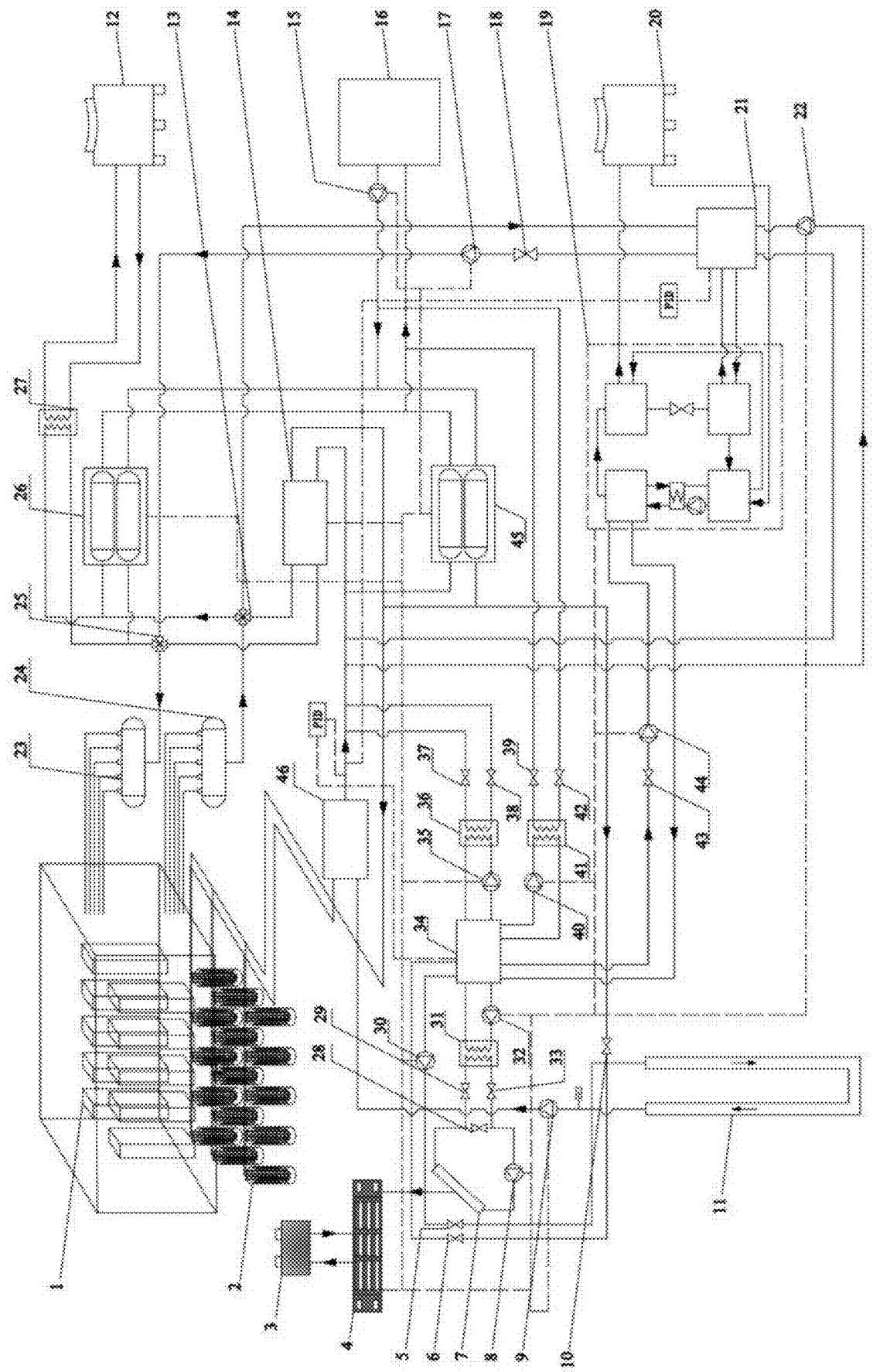

DATA CENTER-BASED MULTI-ENERGY COMPLEMENTARY SYSTEM

CROSS-REFERENCE TO THE RELATED APPLICATIONS

This application is based upon and claims priority to Chinese Patent Application No. 202511021014.6, filed on Jul. 24, 2025, the entire contents of which are incorporated herein by reference.

TECHNICAL FIELD

The present disclosure belongs to the technical field of clean geothermal heating, and particularly relates to a data center-based multi-energy complementary system.

BACKGROUND

With the rapid development of the information society, data centers, as core infrastructure for the digital economy, are facing an increasingly prominent issue of energy consumption. During operation, the data centers generate a large amount of low-grade waste heat. Due to the prevailing lack of efficient and systematic recovery and utilization methods, the waste heat resources are seriously wasted at present, resulting in low energy utilization efficiency. Meanwhile, conventional heating and cooling systems, mostly depending on gas-fired boilers or electrically powered heating and cooling equipment, have problems of low energy efficiency, high carbon emissions, and high operating costs, and hardly meet the requirements of green and low-carbon development under the "dual-carbon" goal. In addition, in terms of energy storage, conventional heat storage devices (such as large water tanks) are physically large, occupying valuable space in machine rooms or auxiliary rooms. Their large-scale deployment in space-constrained data centers is challenging, causing a conflict between space and functional layout.

SUMMARY

An objective of the present disclosure is to provide a data center-based multi-energy complementary system. The present disclosure can realize the combined cooling, heating, and power (CCHP) supply and cross-seasonal energy allocation for the data center, and effectively improves the utilization efficiency for waste heat of the data center. While ensuring the structural safety of the building foundation, the present disclosure efficiently extracts the shallow geothermal energy and releases the waste heat, effectively breaking through the bottleneck issues of conventional thermal storage devices in large space occupation and limited layout, and alleviating the contradiction of tight space resources in the high-density equipment layout of the data center. Meanwhile, the present disclosure can realize the cross-day-and-night and cross-seasonal regulation, storage, and redistribution of heating and cooling energy, improves the spatio-temporal matching efficiency of renewable energy, and enhances the flexibility and stability in system operation.

To achieve the above objective, the present disclosure provides a data center-based multi-energy complementary system, including:

a data center connected to a return header and a supply header;

the return header sequentially connected to a first four-way valve and a first plate heat exchanger;

the first plate heat exchanger sequentially connected to a second four-way valve and the supply header, and connected to a first cooling tower in a loop;

the first four-way valve connected to a chiller, a chilled water tank, and a waste heat pump unit;

the chiller sequentially connected to an energy pile group and a cold-hot water tank to form a loop, and connected to a hot water storage tank and the second four-way valve;

the energy pile group sequentially connected to the cold-hot water tank and a ground source heat pump (GSHP) unit to form a loop;

the hot water storage tank connected to a medium-deep borehole heat exchanger (MDBHE);

the GSHP unit connected to a user in a loop;

the chilled water tank connected to an absorption refrigeration unit in a loop, and connected to the cold-hot water tank and the second four-way valve;

the absorption refrigeration unit connected to the hot water storage tank and a second cooling tower in a loop;

the waste heat pump unit connected to the user in a loop, and connected to the second four-way valve;

the MDBHE sequentially connected to the cold-hot water tank and a third plate heat exchanger, and connected to the GSHP unit;

the third plate heat exchanger connected to the hot water storage tank in a loop;

a solar photovoltaic/thermal (PV/T) panel sequentially connected to a second plate heat exchanger, the hot water storage tank, a fourth plate heat exchanger, and the user in a loop, and connected to an inverter; and the inverter connected to a storage battery in a loop, and connected to various electric devices in the system.

As a further solution to the present disclosure, a twelfth valve and a tenth water circulating pump are connected between the hot water storage tank and the absorption refrigeration unit.

As a further solution to the present disclosure, a fourth valve and a fourth water circulating pump are connected between the chilled water tank and the second four-way valve.

As a further solution to the present disclosure, a connection loop for the solar PV/T panel and the second plate heat exchanger includes a branch provided with a sixth valve, and another branch provided with a first water circulating pump and a seventh valve; a seventh water circulating pump is disposed on a connection loop for the second plate heat exchanger and the hot water storage tank; a ninth water circulating pump is disposed on a connection loop for the hot water storage tank and the fourth plate heat exchanger; and a connection loop for the fourth plate heat exchanger and the user includes a branch provided with a tenth valve, and another branch provided with an eleventh valve and a third water circulating pump.

As a further solution to the present disclosure, a second water circulating pump is disposed between the MDBHE and the cold-hot water tank; an eighth valve is disposed between the cold-hot water tank and the third plate heat exchanger; an eighth water circulating pump is disposed on a connection loop for the hot water storage tank and the third plate heat exchanger; a ninth valve is disposed between the third plate heat exchanger and the GSHP unit; and a third valve is disposed between the waste heat pump unit and the MDBHE.

As a further solution to the present disclosure, a second valve is disposed between the chiller and the hot water storage tank; a sixth water circulating pump and a first valve are disposed between the hot water storage tank and the MDBHE; and a fifth water circulating pump is disposed between the cold-hot water tank and the chilled water tank.

Compared with the prior art, the present disclosure has the following beneficial effects:

The present disclosure constructs a hierarchical heat storage system by means of the energy pile group in the shallow geostructure and the MDBHE, and realizes cascaded energy utilization in combination with the solar PV/T panel technology, thereby forming an integrated system for CCHP supply. Particularly, in combination with the energy pile group that is a structure and function integrated underground energy utilization form, while ensuring the structural safety of the building foundation, the present disclosure efficiently extracts the shallow geothermal energy and releases the waste heat, effectively breaking through the bottleneck issues of conventional thermal storage devices in large space occupation and limited layout, and alleviating the contradiction of tight space resources in the high-density equipment layout of the data center.

Through multi-energy complementary coupling for the waste heat of the data center, the geothermal energy and the solar energy, the present disclosure constructs the heating and cooling storage system with a seasonal regulation capability. The present disclosure can realize the cross-day-and-night and cross-seasonal regulation, storage, and redistribution of heating and cooling energy, improves the spatio-temporal matching efficiency of renewable energy, and enhances the flexibility and stability in system operation, providing critical technical supports for green, low-carbon, highly reliable, and intelligent energy supply of the data center.

BRIEF DESCRIPTION OF THE DRAWINGS

The figure is a schematic view of a data center-based multi-energy complementary system according to the present disclosure.

1: data center, 2: energy pile group, 3: storage battery, 4: inverter, 5: first valve, 6: second valve, 7: solar PV/T panel, 8: first water circulating pump, 9: second water circulating pump, 10: third valve, 11: MDBHE, 12: first cooling tower, 13: first four-way valve, 14: chiller, 15: third water circulating pump, 16: user, 17: fourth water circulating pump, 18: fourth valve, 19: absorption refrigeration unit, 20: second cooling tower, 21: chilled water tank, 22: fifth water circulating pump, 23: supply header, 24: return header, 25: second four-way valve, 26: waste heat pump unit, 27: first plate heat exchanger, 28: fifth valve, 29: sixth valve, 30: sixth water circulating pump, 31: second plate heat exchanger, 32: seventh water circulating pump, 33: seventh valve, 34: hot water storage tank, 35: eighth water circulating pump, 36: third plate heat exchanger, 37: eighth valve, 38: ninth valve, 39: tenth valve, 40: ninth water circulating pump, 41: fourth plate heat exchanger, 42: eleventh valve, 43: twelfth valve, 44: tenth water circulating pump, 45: GSHP unit, and 46: cold-hot water tank.

DETAILED DESCRIPTION OF THE EMBODIMENTS

The present disclosure is further described below with embodiments.

As shown in the figure, a data center-based multi-energy complementary system includes:

data center 1 connected to return header 24 and supply header 23;

the return header 24 sequentially connected to first four-way valve 13 and first plate heat exchanger 27;

the first plate heat exchanger 27 sequentially connected to second four-way valve 25 and the supply header 23, and connected to first cooling tower 12 in a loop;

the first four-way valve 13 connected to chiller 14, chilled water tank 21, and waste heat pump unit 26;

the chiller 14 sequentially connected to energy pile group 2 and cold-hot water tank 46 to form a loop, and connected to hot water storage tank 34 and the second four-way valve 25;

the energy pile group 2 sequentially connected to the cold-hot water tank 46 and GSHP unit 45 to form a loop;

the hot water storage tank 34 connected to MDBHE 11;

the GSHP unit 45 connected to user 16 in a loop;

the chilled water tank 21 connected to absorption refrigeration unit 19 in a loop, and connected to the cold-hot water tank 46 and the second four-way valve 25;

the absorption refrigeration unit 19 connected to the hot water storage tank 34 and second cooling tower 20 in a loop;

the waste heat pump unit 26 connected to the user 16 in a loop, and connected to the second four-way valve 25;

the MDBHE 11 sequentially connected to the cold-hot water tank 46 and third plate heat exchanger 36, and connected to the GSHP unit 45;

the third plate heat exchanger 36 connected to the hot water storage tank 34 in a loop;

solar PV/T panel 7 sequentially connected to second plate heat exchanger 31, the hot water storage tank 34, fourth plate heat exchanger 41, and the user 16 in a loop, and connected to inverter 4; and the inverter 4 connected to storage battery 3 in a loop, and connected to various electric devices in the system. The solar PV/T panel generates a direct current (DC). The inverter is configured to convert the DC of the solar PV/T panel into an available alternating current (AC), so as to supply power to the electric devices in the system. In order to solve the intermittency problem of photovoltaic power generation, i.e., store excess electric energy when sunlight is abundant and supply power to loads at nights and on cloudy days, the storage battery can also be used as a backup power supply to enhance reliability of the system.

After thermal energy generated by the solar PV/T panel 7 is converted into electric energy, the electric energy is partially consumed by the electric devices in the system, with the surplus stored by the storage battery 3 and released when necessary.

In order to regulate an operating state of a heat collection loop formed by the solar PV/T panel 7, the second plate heat exchanger 31, and the hot water storage tank 34, fifth valve 28 is connected between the solar PV/T panel 7 and first water circulating pump 8, such that the solar PV/T panel 7, the fifth valve 28, and the first water circulating pump 8 constitute an integrated solar PV/T assembly. The fifth valve 28 serves as an internal circulation control unit of the integrated solar PV/T assembly. When a difference between an outlet water temperature and an inlet water temperature of the integrated solar PV/T assembly exceeds a preset start-stop threshold (generally set at 5° C.), it is indicated that solar irradiation is adequate and the system possesses the effective heat collection capability. In this case, the fifth valve 28 is closed to cut off an internal circulation loop of the integrated solar PV/T assembly. Meanwhile, the first water circulating pump 8 is started, such that a heat medium forms a closed circulation loop between the solar PV/T panel 7 and the hot water storage tank 34. In this mode, the high-temperature heat medium absorbs the solar radiation through the solar PV/T panel 7 and then is conveyed to the hot water storage tank 34, realizing real-time storage of the thermal energy, and providing an adjustable heat source for loads in subsequent heating or absorption refrigeration. This control strategy not only improves the utilization efficiency of solar energy, but also prevents ineffective circulation in inefficient operation.

The present disclosure includes a refrigeration system operating mode, a heating system operating mode, and a cross-seasonal energy storage system mode. These modes can be adaptively switched according to different environmental conditions, realizing better multi-energy complementary coupling for the waste heat of the data center 1, the geothermal energy and the solar energy.

Further, twelfth valve 43 and tenth water circulating pump 44 are connected between the hot water storage tank 34 and the absorption refrigeration unit 19.

Further, fourth valve 18 and fourth water circulating pump 17 are connected between the chilled water tank 21 and the second four-way valve 25.

Further, a connection loop for the solar PV/T panel 7 and the second plate heat exchanger 31 includes a branch provided with sixth valve 29, and another branch provided with first water circulating pump 8 and seventh valve 33. Seventh water circulating pump 32 is disposed on a connection loop for the second plate heat exchanger 31 and the hot water storage tank 34. Ninth water circulating pump 40 is disposed on a connection loop for the hot water storage tank 34 and the fourth plate heat exchanger 41. A connection loop for the fourth plate heat exchanger 41 and the user 16 includes a branch provided with tenth valve 39, and another branch provided with eleventh valve 42 and third water circulating pump 15.

Further, second water circulating pump 9 is disposed between the MDBHE 11 and the cold-hot water tank 46. Eighth valve 37 is disposed between the cold-hot water tank 46 and the third plate heat exchanger 36. Eighth water circulating pump 35 is disposed on a connection loop for the hot water storage tank 34 and the third plate heat exchanger 36. Ninth valve 38 is disposed between the third plate heat exchanger 36 and the GSHP unit 45. Third valve 10 is disposed between the waste heat pump unit 26 and the MDBHE 11.

Further, second valve 6 is disposed between the chiller 14 and the hot water storage tank 34. Sixth water circulating pump 30 and first valve 5 are disposed between the hot water storage tank 34 and the MDBHE 11. Fifth water circulating pump 22 is disposed between the cold-hot water tank 46 and the chilled water tank 21.

Valves can be opened and closed as needed for an operating mode, thereby controlling an operating circuit of the system. Water circulating pumps can be configured to regulate a flow rate of fluid in the circuit, so as to achieve better operating performance for the mode.

In specific implementation, the refrigeration system operating mode includes three operating modes. The heating system operating mode includes three operating modes. The cross-seasonal energy storage system mode includes two operating modes. Specifically:

I: Refrigeration System Operating Mode:

1) Natural cold source preferred mode:

Start condition: The outside temperature is low in a non-heating season. This mode is used when the outside temperature is below 12° C.

Operating circuit: Data center 1-return header 24-first four-way valve 13-first plate heat exchanger 27-first cooling tower 12-first plate heat exchanger 27-second four-way valve 25-supply header 23-data center 1.

Specifically, heat generated by the data center 1 is first collected centrally by the return header 24. High-temperature fluid sequentially flows through the first four-way valve 13 and a primary side of the first plate heat exchanger 27 to the first cooling tower 12, releasing heat through heat exchange with an outside environment. After flowing from the first cooling tower 12, cooled fluid reversely flows through a secondary side of the first plate heat exchanger 27 for heat exchange, with a direction adjusted by the second four-way valve 25. At last, the cooled fluid is redistributed by the supply header 23 to the data center 1, thereby forming closed-loop circulation, and continuously providing cooling energy for the data center 1. In this mode, a natural cold source in the atmosphere is used to directly cool the machine room.

2) Ground source collaborative refrigeration mode:

Start condition: The outside temperature is relatively high in the non-heating season. This mode is used when the outside temperature is 18-26° C.

Operating circuit: Data center 1-return header 24-first four-way valve 13-chiller 14-energy pile group 2-cold-hot water tank 46-chiller 14-second four-way valve 25-supply header 23-data center 1.

Specifically, after waste heat generated by the data center 1 is collected centrally by the return header 24, return chilled water (with a higher temperature) enters an evaporator of the chiller 14 through the first four-way valve 13, such that the evaporator absorbs heat to form supply chilled water (with a lower temperature). Then, the chilled water flows through a condenser of the chiller 14 to release heat, generating return cooled water. The return cooled water is conveyed to the energy pile group 2, realizing geothermal exchange with surrounding rock and soil for further heat dissipation. The supply chilled water enters the cold-hot water tank 46 after cooled, and then enters the chiller 14 again to be cooled by the condenser. At last, the supply chilled water is conveyed back to the data center 1 by the supply header 23 through the second four-way valve 25, thereby realizing cooling supply circulation. In this mode, heat exchange and waste heat storage are realized by shallow soil where the energy pile group 2 is located, without additional land occupation.

3) Solar-driven refrigeration mode:

Start condition: Peak load period in summer.

Operating circuit: Data center 1-return header 24-first four-way valve 13-chilled water tank 21-absorption refrigeration unit 19-hot water storage tank 34-twelfth valve 43-tenth water circulating pump 44-absorption refrigeration unit 19-chilled water tank 21-fourth valve 18-fourth water circulating pump 17-second four-way valve 25-supply header 23-data center 1.

Specifically, after heat released by the data center 1 is collected centrally by the return header 24, return chilled water enters the chilled water tank 21 through the first four-way valve 13, and is then conveyed to an evaporator of the absorption refrigeration unit 19. In the evaporator, chilled water releases heat to a refrigerant. The refrigerant is evaporated to absorb the heat, such that the chilled water is cooled. After cooled, the chilled water is returned to the chilled water tank 21. After pressurized by the fourth valve 18 and the fourth water circulating pump 17, the chilled water enters the supply header 23 through the second four-way valve 25, and is conveyed to end equipment of the data center 1, realizing cooling supply. Meanwhile, with an independent heat medium loop, a high-temperature heat medium absorbing heat of the solar PV/T panel 7 in the hot water storage tank 34 is pumped to a generator of the absorption refrigeration unit 19 through the twelfth valve 43 and the tenth water circulating pump 44 to heat a diluted lithium bromide solution, such that the diluted lithium bromide solution is decomposed to release refrigerant vapor. A heat-released low-temperature heat medium is returned to the hot water storage tank 34 and reheated, while the solution is circulated in the unit in a closed loop.

II: Heating System Operating Mode:

1) Solar direct supply mode:

Start condition: Early/late heating period or transition season when solar irradiance on days reaches a preset value (the preset value should be comprehensively determined based on a thermal load, the solar PV/T panel and a seasonal sunshine condition) and the ambient temperature is greater than or equal to 5° C.

Operating circuit: Solar PV/T panel 7-sixth valve 29-second plate heat exchanger 31-hot water storage tank 34-ninth water circulating pump 40-fourth plate heat exchanger 41-tenth valve 39-user 16-third water circulating pump 15-eleventh valve 42-fourth plate heat exchanger 41-hot water storage tank 34-seventh water circulating pump 32-second plate heat exchanger 31-seventh valve 33-first water circulating pump 8-solar PV/T panel 7.

Specifically, after solar energy is converted by the solar PV/T panel 7 into thermal energy, heat enters the second plate heat exchanger 31 through the sixth valve 29 for primary heat exchange, and then is stored in the hot water storage tank 34. Driven by the ninth water circulating pump 40, hot water in the hot water storage tank 34 flows through a loop formed by the fourth plate heat exchanger 41 and the user 16 for secondary heat exchange. After the thermal energy is conveyed to the user 16, return water is pressurized by the third water circulating pump 15, and flows through the fourth plate heat exchanger 41 again through the eleventh valve 42, so as to recover waste heat. At last, the return water is returned to the hot water storage tank 34 to absorb the heat energy, thereby forming heating circulation.

2) Waste heat dominant mode:

Start condition: Early/late stage of the heating season.

Operating Circuit:

Circuit (1): Data center 1-return header 24-first four-way valve 13-waste heat pump unit 26-user 16-third water circulating pump 15-waste heat pump unit 26-second four-way valve 25-supply header 23-data center 1.

Circuit (2): Energy pile group 2-cold-hot water tank 46-GSHP unit 45-user 16-third water circulating pump 15-GSHP unit 45-energy pile group 2.

Specifically: During the early and late stages of the heating season, the real-time waste heat from the data center 1 and the energy pile group 2 can be used for combined heating. Heat generated by the data center 1 in operation is collected by the return header 24 and then conveyed to the waste heat pump unit 26 for heat upgrading. After low-grade thermal energy extracted by the energy pile group 2 from underground rock and soil is upgraded by the GSHP unit 45, two heat sources are integrated and connected to a heating loop of the user 16 in parallel, realizing combined energy supply. After releasing heat, return water flows back to the waste heat pump unit 26 and the GSHP unit 45 through the third water circulating pump 15, entering the cooling circulation of the data center 1 and the geothermal exchange loop of the energy pile group 2 to form closed circulation. This effectively utilizes the real-time waste heat of the data center 1 and the heat stored by the energy pile group 2 in the non-heating season.

3) Geothermal-solar combined mode:

Start condition: Severe cold period.

Operating circuit: MDBHE 11-second water circulating pump 9-cold-hot water tank 46-eighth valve 37-third plate heat exchanger 36-hot water storage tank 34-eighth water circulating pump 35-third plate heat exchanger 36-ninth valve 38-GSHP unit 45-user 16-third water circulating pump 15-GSHP unit 45-third valve 10-MDBHE 11.

Specifically, when the outside temperature is relatively low during the severe cold period, the MDBHE 11 and the solar energy can be used for auxiliary heating. Heat extracted by the MDBHE 11 from surrounding rock is conveyed to the cold-hot water tank 46 through the second water circulating pump 9. When an outlet temperature of the MDBHE 11 is lower than a preset threshold temperature of the hot water storage tank 34, real-time monitoring is triggered through a proportional-integral-derivative (PID) controller for regulation. Low-temperature fluid is converted through the eighth valve 37 into a high-temperature medium in the third plate heat exchanger 36 and the hot water storage tank 34 for heat exchange. Then, driven by the eighth water circulating pump 35, resulting fluid flows through the third plate heat exchanger 36 for secondary heat exchange, and enters the GSHP unit 45 through the ninth valve 38 for further heating, finally supplying heat to the user 16. Return water flows to the GSHP unit 45 through the third water circulating pump 15. After releasing heat, the return water is re-injected into the MDBHE 11 to form circulation. This effectively utilizes the medium-deep geothermal energy and the solar thermal energy.

III. Cross-seasonal energy storage system mode:

1) Shallow energy storage mode:

Heat storage medium: Soil around the energy pile group 2.

Heat injection period: Waste heat from the data center 1 is injected continuously in the non-heating season. The refrigeration process with the energy pile group in the ground-source collaborative refrigeration mode has been described, and is not repeated herein.

2) Deep energy storage mode:

Heat storage medium: Medium and deep rock and soil.

Operating circuit: Data center 1-return header 24-first four-way valve 13-chiller 14-third valve 10-second valve 6-hot water storage tank 34-sixth water circulating pump 30-first valve 5-MDBHE 11-second valve 9-cold-hot water tank 46-fifth water circulating pump 22-chilled water tank 21-chiller 14-second four-way valve 25-supply header 23-data center 1.

Specifically, after waste heat generated by the data center 1 in operation is collected by the return header 24, fluid enters the evaporator of the chiller 14 through the first four-way valve 13 to absorb heat. Then, the fluid releases the heat through a condenser, flows to the hot water storage tank 34 through the third valve 10 and the second valve 6, and is secondarily heated to a preset temperature. High-temperature fluid reaching a temperature threshold flows out from the hot water storage tank 34, and enters the MDBHE 11 through the first valve 5 to exchange heat with underground surrounding rock, so as to realize long-term storage of the thermal energy. Fluid having heat stored flows to the cold-hot water tank 46 through the second water circulating pump 9 for temporary storage. When the PID monitors that the temperature of the chilled water tank 21 is lower than the temperature of fluid from the cold-hot water tank 46 by a preset threshold, the high-temperature fluid in the cold-hot water tank 46 is conveyed to the chilled water tank 21 through the fifth water circulating pump 22 for cooling, and then flows to the chiller 14 to restore the cooling capacity. Resulting fluid is distributed by the supply header 23 through the second four-way valve 25 to the data center 1, realizing cooling supply circulation.

The present disclosure establishes a three-level temperature-gradient energy storage system (shallow/medium/deep layer), and develops the dual-effect utilization technology for the solar PV/T panel, forming the multi-energy complementary system for the waste heat, the geothermal energy and the solar energy. Eight operating modes are provided to meet different use requirements. In the transition season, shallow/deep bidirectional heat storage is implemented synchronously. In extreme climates, solarthermal-geothermal combined energy supply is started. In peak electricity consumption periods, the storage battery is used in conjunction with municipal power for peak shaving.

What is claimed is:

1. A data center-based multi-energy complementary system, comprising:

a data center connected to a return header and a supply header;

the return header sequentially connected to a first four-way valve and a first plate heat exchanger;

the first plate heat exchanger sequentially connected to a second four-way valve and the supply header, and connected to a first cooling tower in a loop;

the first four-way valve connected to a chiller, a chilled water tank, and a waste heat pump unit;

the chiller sequentially connected to an energy pile group and a cold-hot water tank to form a loop, and connected to a hot water storage tank and the second four-way valve;

the hot water storage tank connected to a medium-deep borehole heat exchanger (MDBHE);

the chilled water tank connected to an absorption refrigeration unit in a loop, and connected to the cold-hot water tank and the second four-way valve;

the waste heat pump unit connected to a user in a loop, and connected to the second four-way valve;

a solar photovoltaic/thermal (PV/T) panel sequentially connected to a second plate heat exchanger, the hot water storage tank, a fourth plate heat exchanger, and the user in a loop, and connected to an inverter; and the inverter connected to a storage battery in a loop, and connected to various electric devices in the system;

further comprising:

the energy pile group sequentially connected to the cold-hot water tank and a ground source heat pump (GSHP) unit to form a loop;

the GSHP unit connected to the user in a loop;

the absorption refrigeration unit connected to the hot water storage tank and a second cooling tower in a loop;

the MDBHE sequentially connected to the cold-hot water tank and a third plate heat exchanger, and connected to the GSHP unit; and the third plate heat exchanger connected to the hot water storage tank in a loop.

2. The data center-based multi-energy complementary system according to claim 1, wherein a twelfth valve and a tenth water circulating pump are connected between the hot water storage tank and the absorption refrigeration unit.

3. The data center-based multi-energy complementary system according to claim 1, wherein a fourth valve and a fourth water circulating pump are connected between the chilled water tank and the second four-way valve.

4. The data center-based multi-energy complementary system according to claim 1, wherein a connection loop for the solar PV/T panel and the second plate heat exchanger comprises a branch provided with a sixth valve, and another branch provided with a first water circulating pump and a seventh valve; a seventh water circulating pump is disposed on a connection loop for the second plate heat exchanger and the hot water storage tank; a ninth water circulating pump is disposed on a connection loop for the hot water storage tank and the fourth plate heat exchanger; and a connection loop for the fourth plate heat exchanger and the user comprises a branch provided with a tenth valve, and another branch provided with an eleventh valve and a third water circulating pump.

5. The data center-based multi-energy complementary system according to claim 1, wherein a second water circulating pump is disposed between the MDBHE and the cold-hot water tank; an eighth valve is disposed between the cold-hot water tank and the third plate heat exchanger; an eighth water circulating pump is disposed on a connection loop for the hot water storage tank and the third plate heat exchanger; a ninth valve is disposed between the third plate heat exchanger and the GSHP unit; and a third valve is disposed between the GSHP unit and the MDBHE.

6. The data center-based multi-energy complementary system according to claim 1, wherein a second valve is disposed between the chiller and the hot water storage tank; a sixth water circulating pump and a first valve are disposed between the hot water storage tank and the MDBHE; and a fifth water circulating pump is disposed between the cold-hot water tank and the chilled water tank.

\* \* \* \* \*